US010931097B2

(12) United States Patent
Chowdhury et al.

(10) Patent No.: US 10,931,097 B2
(45) Date of Patent: Feb. 23, 2021

(54) GENERATOR STATOR GROUND PROTECTION USING THIRD HARMONIC

(71) Applicant: Schweitzer Engineering Laboratories, Inc., Pullman, WA (US)

(72) Inventors: Ritwik Chowdhury, Toronto (CA); Dale S. Finney, Little Bras D'or (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 110 days.

(21) Appl. No.: 16/106,538

(22) Filed: Aug. 21, 2018

(65) Prior Publication Data

US 2019/0097417 A1 Mar. 28, 2019

Related U.S. Application Data

(60) Provisional application No. 62/562,759, filed on Sep. 25, 2017.

(51) Int. Cl.
*G01R 31/34* (2020.01)
*H02H 7/06* (2006.01)
*F01D 15/10* (2006.01)
*H02H 3/52* (2006.01)
*G01R 31/50* (2020.01)
(Continued)

(52) U.S. Cl.
CPC .............. *H02H 7/06* (2013.01); *F01D 15/10* (2013.01); *G01R 31/343* (2013.01); *G01R 31/50* (2020.01); *H02H 3/52* (2013.01); *F05D 2220/76* (2013.01); *G01R 19/2513* (2013.01); (Continued)

(58) Field of Classification Search
CPC .... G01R 31/025; G01R 31/50; G01R 31/343; G01R 31/346; H02H 1/0007; H02H 1/0092; H02H 3/083; H02H 3/16; H02H 3/52; H02H 7/06; H02H 7/26
See application file for complete search history.

(56) References Cited

U.S. PATENT DOCUMENTS 2,881,319 A 4/1959 Sills
3,727,123 A 4/1973 Smith
(Continued)

FOREIGN PATENT DOCUMENTS

CN 203324449 U 12/2013
JP 53107640 9/1978
(Continued)

OTHER PUBLICATIONS

Rik Pintelon, Johan Schoukens, System Identification: A Frequency Domain Approach, Section 4.3 (pp. 119-131), Jan. 1, 2001.
(Continued)

*Primary Examiner* — Minh N Tang
(74) *Attorney, Agent, or Firm* — Bradley W. Schield; Richard M. Edge

(57) ABSTRACT

Detection of electric power generator stator ground fault conditions and protection of the generator due to such conditions is provided herein. In one embodiment, a generator protection element may calculate generator third harmonic voltage quantities using measurements from the generator terminals, and determine a stator ground fault condition using the calculated generator third harmonic voltage quantity. A tripping subsystem may issue a trip command based upon detection of a stator ground fault condition.

20 Claims, 6 Drawing Sheets

(51) Int. Cl.
  *H02H 3/08* (2006.01)
  *G01R 19/25* (2006.01)
  *G01R 21/00* (2006.01)
  *H02H 3/16* (2006.01)

(52) U.S. Cl.
  CPC .......... *G01R 21/001* (2013.01); *H02H 3/083* (2013.01); *H02H 3/16* (2013.01)

(56) References Cited

U.S. PATENT DOCUMENTS

| | | |
|---|---|---|
| 3,973,171 A | 8/1976 | Howell |
| 4,000,464 A | 12/1976 | Nussel |
| 4,001,646 A | 1/1977 | Howell |
| 4,029,951 A | 6/1977 | Berry |
| 4,066,950 A | 1/1978 | Rumold |
| 4,088,935 A | 5/1978 | D'Atre |
| 4,148,087 A | 4/1979 | Phadke |
| 4,156,186 A | 5/1979 | Wolfinger |
| 4,159,499 A | 6/1979 | Breskin |
| 4,161,011 A | 7/1979 | Wilkinson |
| 4,206,398 A | 6/1980 | Janning |
| 4,245,182 A | 1/1981 | Aotsu |
| 4,321,643 A | 3/1982 | Vernier |
| 4,371,832 A | 2/1983 | Wilson |
| 4,511,811 A | 4/1985 | Gupta |
| 4,542,468 A | 9/1985 | Taniguti |
| 4,556,946 A | 12/1985 | Taniguti |
| 4,558,309 A | 12/1985 | Antonevich |
| 4,667,263 A | 5/1987 | Morris |
| 4,763,057 A | 8/1988 | Danz |
| 4,820,991 A | 4/1989 | Clark |
| 4,825,327 A | 4/1989 | Alexander |
| 4,851,758 A | 7/1989 | Ostada |
| 4,939,506 A | 7/1990 | Gram |
| 4,982,147 A | 1/1991 | Lauw |
| 5,057,962 A | 10/1991 | Alley |
| 5,252,915 A | 10/1993 | Sedding |
| 5,264,778 A | 11/1993 | Kimmel |
| 5,363,047 A | 11/1994 | Dresti |
| 5,365,396 A | 11/1994 | Roberts |
| 5,471,880 A | 12/1995 | Lang |
| 5,508,620 A | 4/1996 | Pfiffner |
| 5,514,963 A | 5/1996 | Korbmacher |
| 5,519,300 A | 5/1996 | Leon |
| 5,581,470 A | 12/1996 | Pawloski |
| 5,592,393 A | 1/1997 | Yalla |
| 5,633,550 A | 5/1997 | Meehan |
| 5,675,465 A | 10/1997 | Tanaka |
| 5,739,693 A | 4/1998 | Pfiffner |
| 5,764,462 A | 6/1998 | Tanaka |
| 5,805,395 A | 9/1998 | Hu |
| 5,933,306 A | 8/1999 | Santos |
| 5,963,404 A | 10/1999 | Guzman-Casillas |
| 5,982,595 A | 11/1999 | Pozzuoli |
| 6,121,886 A | 9/2000 | Anderson |
| 6,137,187 A | 10/2000 | Mikhail |
| 6,169,489 B1 | 1/2001 | Kliman |
| 6,262,550 B1 | 7/2001 | Kliman |
| 6,294,898 B2 | 9/2001 | Lawson |
| 6,396,284 B1 | 5/2002 | Tisdale |
| 6,426,632 B1 | 7/2002 | Clunn |
| 6,459,269 B1 | 10/2002 | Jones |
| 6,492,801 B1 | 12/2002 | Sims |
| 6,496,757 B1 | 12/2002 | Flueck |
| 6,525,504 B1 | 2/2003 | Nygren |
| 6,714,020 B2 | 3/2004 | Hobelsberger |
| 6,721,671 B2 | 4/2004 | Roberts |
| 6,794,879 B2 | 9/2004 | Lawson |
| 6,794,883 B2 | 9/2004 | Klingel |
| 6,815,932 B2 | 11/2004 | Wall |
| 6,839,207 B2 | 1/2005 | Falliot |
| 6,924,565 B2 | 8/2005 | Wilkins |
| 6,924,628 B2 | 8/2005 | Thompson |
| 6,975,946 B2 | 12/2005 | Al-Hamrani |
| 6,992,490 B2 | 1/2006 | Nomoto |
| 7,006,935 B2 | 2/2006 | Seki |
| 7,253,634 B1 | 8/2007 | Kasztenny |
| 7,304,403 B2 | 12/2007 | Xu |
| 7,498,818 B2 | 3/2009 | Benmouyal |
| 7,528,611 B2 | 5/2009 | Kasztenny |
| 7,532,010 B2 | 5/2009 | Kamel |
| 7,592,772 B2 | 9/2009 | Nandi |
| 7,693,607 B2 | 4/2010 | Kasztenny |
| 7,710,693 B2 | 5/2010 | Guzman-Casillas |
| 7,804,303 B2 | 9/2010 | Benmouyal |
| 8,405,940 B2 | 3/2013 | Schweitzer, III |
| 8,847,603 B2 * | 9/2014 | Gajic ................ G01R 31/50 324/510 |
| 9,236,726 B2 * | 1/2016 | Safari-Shad ............ H02H 7/06 |
| 9,496,707 B2 | 11/2016 | Thompson |
| 10,333,291 B2 * | 6/2019 | Chowdhury ......... G01R 31/346 |
| 2001/0001534 A1 | 5/2001 | Lawson |
| 2002/0128759 A1 | 9/2002 | Sodoski |
| 2002/0140433 A1 | 10/2002 | Lawson |
| 2003/0085715 A1 | 5/2003 | Lubkeman |
| 2005/0033481 A1 | 2/2005 | Budhraja |
| 2006/0125486 A1 | 6/2006 | Premerlani |
| 2007/0085549 A1 | 4/2007 | Fischer |
| 2008/0074810 A1 | 3/2008 | Guzman-Casillas |
| 2009/0039655 A1 | 2/2009 | Berchowitz |
| 2009/0160454 A1 | 6/2009 | Johansson |
| 2009/0219030 A1 | 9/2009 | Salem |
| 2009/0254297 A1 | 10/2009 | Bengtsson |
| 2010/0194324 A1 | 8/2010 | Kasztenny |
| 2011/0085272 A1 | 4/2011 | Schweitzer |
| 2011/0158786 A1 | 6/2011 | Molitor |
| 2012/0112758 A1 | 5/2012 | Weems |
| 2013/0300209 A1 | 11/2013 | Long |
| 2015/0051852 A1 | 2/2015 | Pan |
| 2015/0222122 A1 | 8/2015 | Nuqui |
| 2016/0025811 A1 | 1/2016 | Kasztenny |
| 2016/0049891 A1 | 2/2016 | Frampton |
| 2016/0181790 A1 | 6/2016 | Thompson |

FOREIGN PATENT DOCUMENTS

| | | |
|---|---|---|
| JP | 56002569 | 1/1981 |
| JP | 03212117 | 9/1991 |
| JP | 07177646 | 7/1995 |
| JP | 11133093 | 5/1999 |
| JP | 2000333359 | 11/2000 |
| WO | WO0239642 | 5/2002 |
| WO | WO2014067742 | 5/2014 |

OTHER PUBLICATIONS

Beckwith Electric Co., Inc., M-3425A Generator Protection flyer, 2001.
Beckwith Electric Co., Inc., M-3425A Generator Protection Instruction Book, 2004.
Siemens AG, Numerical Machine Protection Manual 7UM515 V3.1, Published 1996.
ABB, Type DGF Generator Field Relay Instruction Leaflet, ABB Inc. Feb. 1977.
J.Lewis Blackburn, Protective Relaying Principles and Applications, Chapter 8: Generator Protection, pp. 262-267, 1997.
TYCO Electronics Energy Division, Installation and Operating Instructions R.O.C.O.F. Protection Relay, Issue 1, Nov. 2002.
PCT/US2010/052452, Patent Cooperation Treaty, International Search Report and Written Opinion of the International Searching Authority, dated Dec. 9, 2010.
Dale Finney and Gerald Johnson, Loss of Prime Mover (Antimotoring) Protection, IEEE Tutorial on the Protection of Synchronous Generators, Special Publication of the IEEE Power System Relaying Committee, Second Ed., Chapter 3, Section 5, 2011.
IEEE, IEEE Guide for AC Generator Protection, IEEE STD C37.102-1006, pp. 68-70, 2007.
Michael Simpson and John Merrell, Low Zero-Sequence Impedances on Generators, Aug. 30, 2000.

(56) References Cited

OTHER PUBLICATIONS

Mu Longhua and Li Xiaobo, Selective Ground-fault Protection Using an Adaptive Algorithm Model in Neutral Ungrounded Power Systems, IEEE International Conference on Power System Technology, Dec. 2000.

PCT/US2015/056870, Patent Cooperation Treaty, International Search Report and Written Opinion of the International Searching Authority, dated Jan. 14, 2016.

Benmouyal, G. "The Impact of Synchronous Generators Excitation Supply on Protection Relays". Schweitzer Engineering Laboratories, Inc. Oct. 29, 2007.

PCT/US2015/041950 Patent Cooperation Treaty, International Search Report and Written Opinion of the International Searching Authority, dated Oct. 16, 2015.

Schweitzer Engineering Laboratories, Inc., SEL-300G Generator Relay flyer, Jun. 22, 2007.

Klingerman, Nathan, Et al., "Understanding Generator Stator Ground Faults and Their Protection Schemes", Presented at the 42nd Annual Western Protective Relay Conference, Oct. 2015.

Beckwith Electric Co., Inc., Application Note #27, "Beckwith Electric M-3425A Generator Protection Relay Setting Clarification 27TN Third Harmonic Undervoltage Element", Dec. 13, 2004.

Siemens, Siprotec 5 Generator Protection 7UM85 Manual, Sections 6.7-6.9, Nov. 2015.

\* cited by examiner

GENERATOR STATOR GROUND PROTECTION USING THIRD HARMONIC

RELATED APPLICATIONS

The present application claims the benefit under 35 U.S.C. § 119(e) of U.S. Provisional Patent Application No. 62/562,759, entitled "Generator Stator Ground Protection Using Third Harmonic", filed Sep. 25, 2017, which is herein incorporated by reference in its entirety and for all purposes.

TECHNICAL FIELD

This disclosure relates to techniques that may be utilized to detect stator ground faults in an electric power generator. More particularly, but not exclusively, the present disclosure is applicable to providing secure neutral side protection to high-impedance grounded generators with y-ungrounded or delta-connected terminal potential transformers. The element provides protection to a well-defined percentage of the neutral side of the stator winding.

BRIEF DESCRIPTION OF THE DRAWINGS

Non-limiting and non-exhaustive embodiments of the disclosure are described, including various embodiments of the disclosure with reference to the figures, in which.

Figure 1:
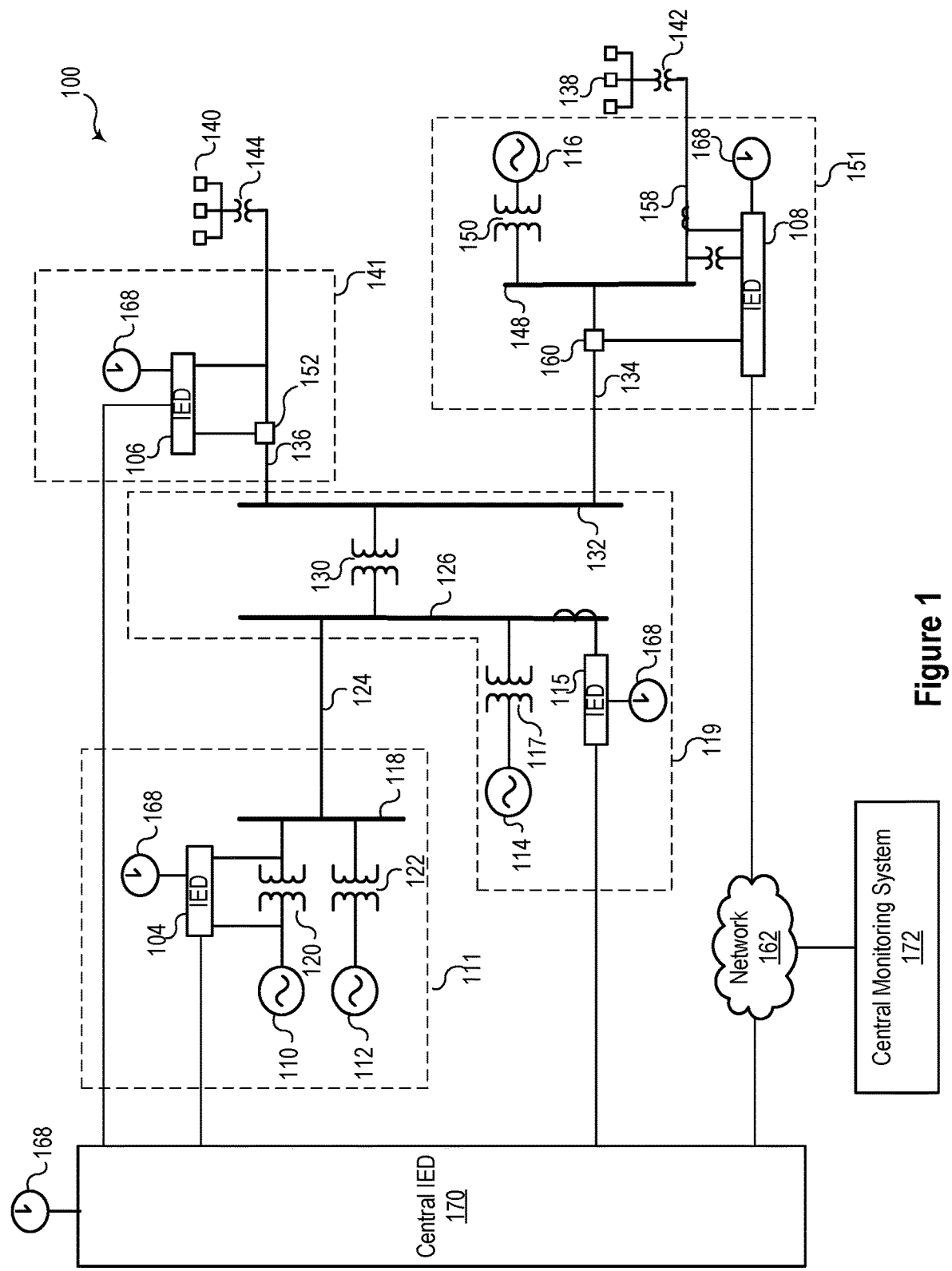
FIG. 1 illustrates an example of an embodiment of a simplified one-line diagram of an electric power delivery system with various substations consistent with embodiments of the present disclosure.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power generators may experience a variety of stator faults including, for example, stator winding-to-winding faults, stator winding-to-ground faults (also known as stator ground faults), and the like. Prompt and secure detection of such faults followed by fast tripping of the generator may result in a reduction of damage to the generator caused by the fault in the stator. In certain embodiments, the apparatuses and methods discussed herein may be advantageously used to detect stator winding-to-ground faults, which is the most likely fault-type in a generator.

The method of ground fault detection on an electric power generator depends on the type of machine grounding employed. For units that are solidly grounded or low-impedance (resistance/reactance) grounded, there is sufficient fault current available to measure. Consequently, elements that use current as an operating signal e.g. over-current (50/51N), directional-overcurrent (67N), ground differential (87N), restrictive earth fault (REF) etc. can sensitively detect stator faults including winding-to-winding faults and stator ground faults.

For high-impedance (resistance/resonant) grounded systems or ungrounded systems, ground fault currents are limited to very low values by the grounding impedance and the capacitances around the generator. Protection elements that use current provide very limited sensitivity. However, there is sufficient voltage available during a fault instead providing a mechanism to detect stator-ground faults. The fundamental neutral over-voltage (59N) function provides stator-ground fault protection coverage for a majority (e.g. 90%) of ground faults in the upper stator-winding region (e.g., windings electrically closer to the terminals than the neutral). However, a fault close to the neutral, such as a fault within the remaining windings closer to the neutral than the terminals, does not cause a significant imbalance in the fundamental voltage quantities and places a limit on the sensitivity of 59N. Accordingly, additional protection is needed to detect faults on 100% of the stator windings.

During normal operation, the third harmonic and other harmonics are present in the generator voltages. These harmonics exist due to a non-sinusoidal winding function and non-uniform air-gap. The internal voltage ($E_i$) drives the flux which, in turn, produces the voltage. $E_i$ varies with machine loading.

Both the neutral and terminal voltages are typically measured. When the terminal voltages are measured via Y-grounded or broken-delta potential transformers (PT), the measured third-harmonic voltages can be used to provide neutral side protection for the generator. When the terminal voltages are measured via open-delta or Y-ungrounded PT's, the third harmonic voltages at the terminals cannot be measured, consequently neutral side protection is provided using neutral third-harmonic under-voltage (27TN). There are two major problems with 27TN:

1) It is not inherently secure. The $3^{rd}$ harmonic produced by the generator varies over a wide range during normal operation. Accordingly, the commissioning staff must carry out a detailed survey of the neutral $3^{rd}$ harmonic voltages at various loading conditions. The survey data is then analyzed by the protection engineer to determine a secure setting.

2) It does not have a well-defined coverage. When the machine produces a large amount of $3^{rd}$ harmonic, as is a case when the machine is producing a significant amount of real and reactive power, 27TN will not provide ground-fault protection coverage to a significant portion of the neutral side of the stator winding. This leaves a significant portion of the winding unprotected. Accordingly, the present disclosure uses measurements from the electric power generator to calculate the third harmonic voltage of the generator and provide stator ground protection using the calculated third harmonic voltage. The ground-fault protection is provided to a unit-connected generator i.e. a single high-impedance generator connected to the system via a delta-wye transformer.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and/or a product of a process.

The phrases "connected to," "networked," and "in communication with" refer to any form of interaction between two or more entities, including mechanical, electrical, magnetic, and electromagnetic interaction. Two components may be connected to each other, even though they are not in direct physical contact with each other and even though there may be intermediary devices between the two components.

Some of the infrastructure that can be used with embodiments disclosed herein are already available, such as: general-purpose computers, computer programming tools and techniques, digital storage media, and optical networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as: non-volatile memory, static RAM, dynamic RAM, ROM, CD-ROM, disk, tape, magnetic, optical, flash memory, or other computer readable storage medium.

The described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order.

In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates an example of an embodiment of a simplified one-line diagram of an electric power delivery system 100 with various substations consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, and 158), circuit breakers (e.g., breakers 152 and 160), busses (e.g., busses 118, 126, 132, and 148), loads (e.g., loads 140, and 138) and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

According to various embodiments, central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

Communication via network 162 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 100.

The electric power delivery system 100 illustrated in FIG. 1 may include a generation substation 111. Substation 111 may include various generators 110 and 112 connected to a bus 118 through step-up transformers 120 and 122. Bus 118 may be connected to bus 126 in substation 119 via transmission line 124. Although the equipment in substation 111 may be monitored and/or controlled by various IEDs, only a single IED 104 is shown. IED 104 may be a transformer protection IED for transformer 120.

A common time signal may be distributed throughout system 100. Utilizing a common or universal time source may ensure that IEDs have a synchronized time signal that can be used to generate time synchronized data, such as synchrophasors. In various embodiments, IEDs 104, 106, 108, 115, 170 may receive a common time signal 168. The time signal may be distributed in system 100 using a communications network 162 or using a common time source, such as a Global Navigation Satellite System ("GNSS"), or the like.

In various embodiments, one or more of generators 110, 112, 114, or 116 may be susceptible to damage from a stator fault. The generators 110, 112, 114, and 116 may be monitored and/or controlled by an IED configured to identify stator ground fault using a calculated third harmonic voltage of the stator and trip the generator upon detection of a fault condition.

Figure 2A:
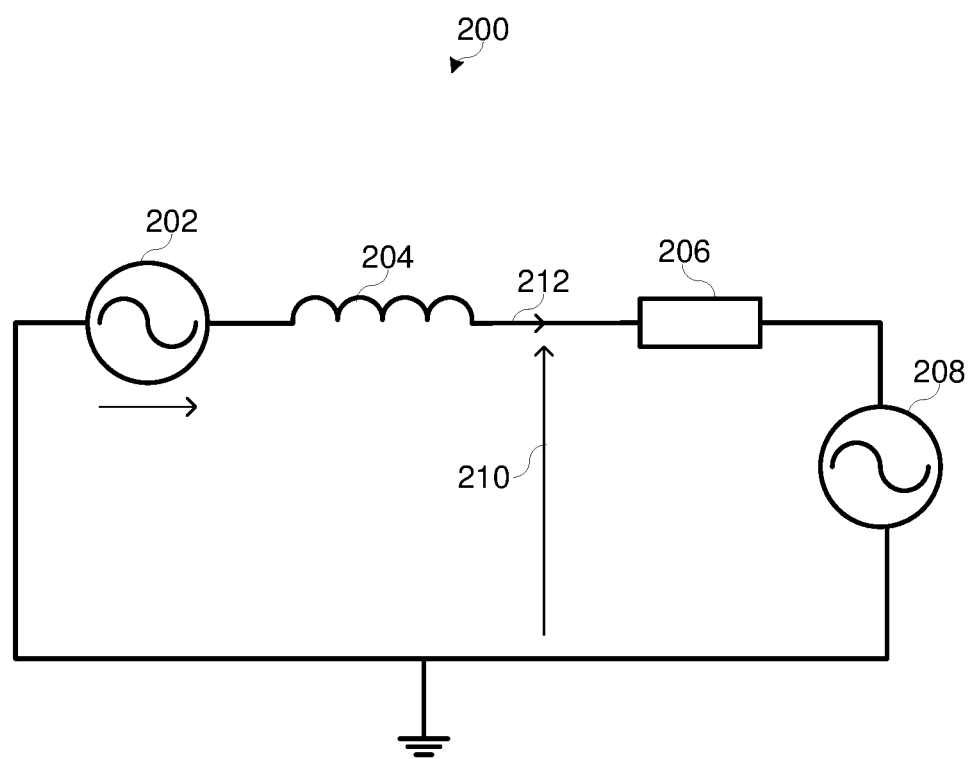
FIG. 2A illustrates a representative simplified circuit diagram of the fundamental components of an electric power generator, in accordance with embodiments of the present disclosure.

FIG. 2A illustrates a simplified diagram of an equivalent fundamental circuit of a generator 200. The equivalent circuit includes an internal voltage $E_i$ 202. Current from the source 202 flows through source impedance 204, which depends on the generator's synchronous impedances $X_d$, $X_q$. Current $I_t$ 212 flows through system impedance $Z_{sys}$ 206 and system equivalent source voltage $V_{sys}$ 208. Voltage $V_t$ 210 may be measured across the terminals along with the current $I_t$. As described in more detail herein, the internal voltage $E_i$ may be calculated using the fundamental signals, the measured terminal voltage $V_t$ and current $I_t$, and the source impedance settings $X_d$ and $X_q$.

Figure 2B:
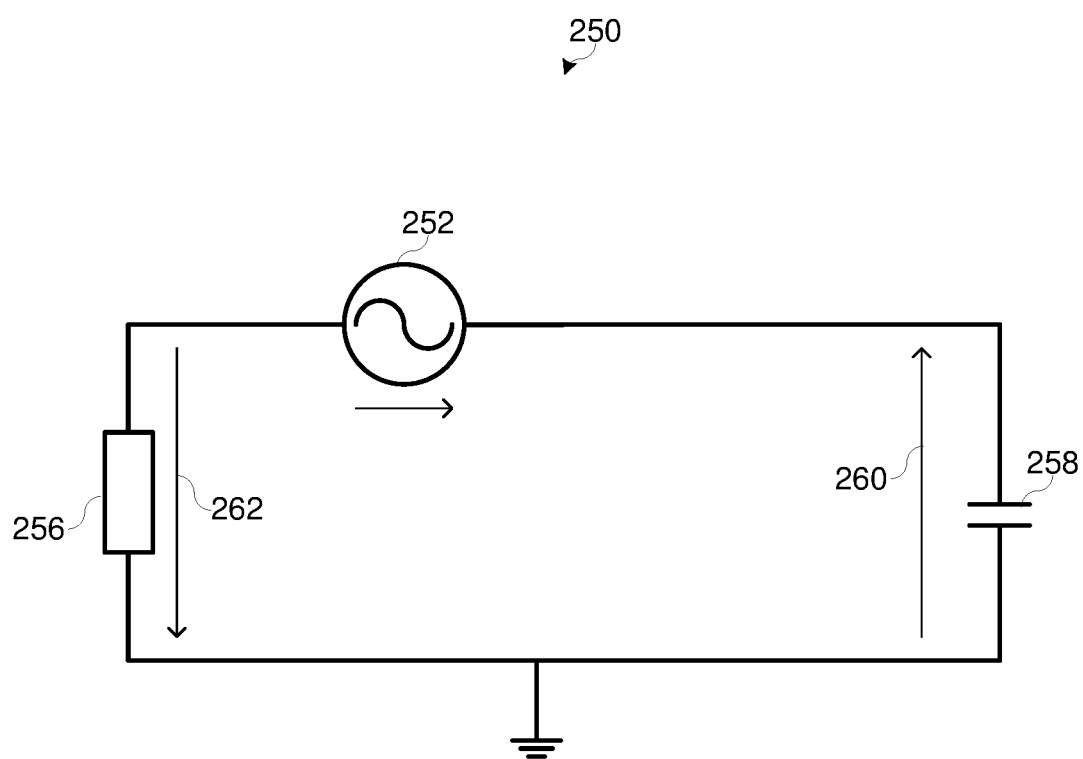
FIG. 2B illustrates a representative simplified circuit diagram of third harmonic components of an electric power generator, in accordance with embodiments of the present disclosure.

FIG. 2B illustrates a simplified diagram of an equivalent third harmonic circuit of a generator 250. A third harmonic neutral voltage VN3 262 and third harmonic terminal voltage VT3 260 may be used to provide stator ground protection as provided herein. The phasor sum of the two voltages VN3 262 and VT3 260 result in the generator third harmonic voltage VG3 252. The equivalent circuit 250 also illustrates the neutral impedance $Z_{n3}$ 256 which is a combination of the parallel neutral-grounding impedance and contribution from the stator-ground capacitance, and terminal capacitance $X_{t3}$ 258 which has contribution from the machine's stator-ground capacitance, surge capacitance and GSU winding-to-ground capacitances. The third harmonic voltage at terminals VT3 260 may be a filtered third harmonic voltage from the terminal voltage VT 210 which drops across $X_{t3}$ 258. The third harmonic neutral voltage VN3 may be a filtered third harmonic neutral voltage between the neutral of the generator and the ground.

The ratio of the neutral voltage third harmonic VN3 to the generator third harmonic voltage VG3 may be used to detect stator ground faults. In normal (unfaulted) conditions, the ratio of VN3/VG3 remains relatively constant at a value ranging from 0.40 to 0.80, depending on the impedance network around the high-impedance grounded unit. Accordingly, a fault may be detected when the ratio is less than a pickup value. The pickup may be a per-unit stator winding desired to be protected. The pickup value may be, for example 0.15 in per-unit. While VG3 is typically calculated as a phasor sum of VN3 and VT3, it may also be obtained directly by a PT measuring the zero-sequence voltage from the generator terminals with respect to the neutral.

In many applications, i.e. when the terminal PT is not Y-grounded or broken-delta, the third harmonic voltage produced by the generator VG3 cannot be calculated via a phasor sum of VN3 and VT3, as VT3 is unavailable. Instead, according to several embodiments herein, VG3 may be calculated using measurements available. According to one embodiment, the third harmonic voltage VG3 may be calculated using a predetermined setting of a no-load third harmonic voltage VG3NL. The VG3NL setting may be set by the user. VG3NL may allow for estimation of the internal third harmonic voltage because at no load, $V_t = E_i$. The setting VG3NL can be computed offline by measuring the no-load neutral third harmonic voltage VN3NL and using available information such as capacitance values used to size the neutral impedance of the generator). For example, for typical high-resistance generators, VG3NL~k*VN3NL, where k is typically around 1.65, but can range from around 1.3 to around 2.2, depending on the value of surge capacitance, neutral resistance, and other such parameters of the generator installation.

In another embodiment, the third harmonic voltage VG3 may be calculated by measuring the field current. The field current magnitude may be normalized with respect to the rated field current and multiplied with the VG3NL setting to estimate the third harmonic produced by the generator.

Figure 3:
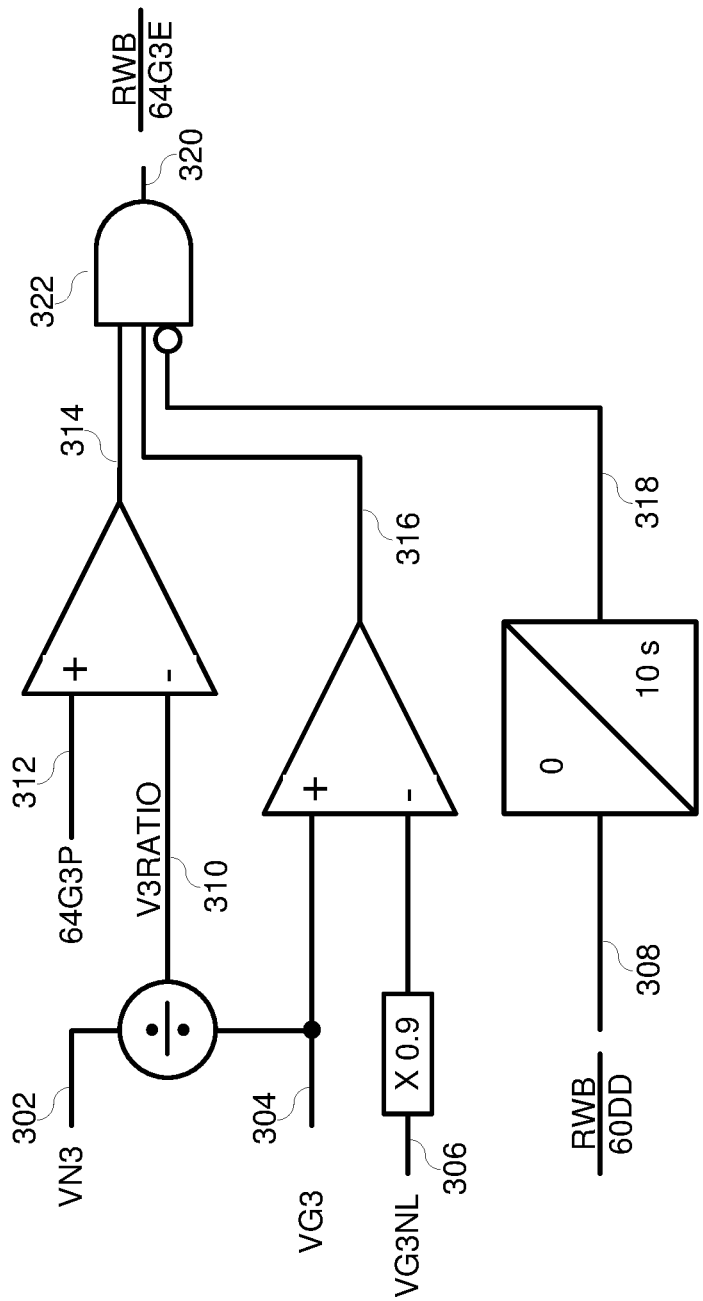
FIG. 3 illustrates logic useful for calculating an estimated third harmonic ratio element pickup value, in accordance with embodiments of the present disclosure.

FIG. 3 illustrates a logic diagram for applying stator ground protection using a calculated third harmonic generator voltage VG3 as discussed herein. The method represented by the illustrated logic diagram detects a stator fault condition 314 when the third harmonic voltage ratio V3RATIO 310 is less than the stator ground pickup element threshold 64G3P 312. The V3RATIO is calculated by dividing the measured neutral third harmonic voltage magnitude VN3 302 (which may be normalized in a per-unit value) by a third harmonic voltage magnitude VG3 304 (which may be normalized in a per-unit value, and estimated according to the various embodiments described herein). Although further elements are present in the logic diagram as illustrated, the stator fault condition may be determined simply using the comparison of the ratio with the threshold setting as described herein.

Typically, the generator third harmonic voltage VG3 is calculated as the magnitude of the phasor sum of the neutral and terminal third harmonic measurements (VG3=|VN3+VT3|). In other embodiments, an estimate of third harmonic generator voltage VG3EST may be used to replace the third harmonic generator voltage VG3 304. VG3EST may be calculated using the following equation:

$$VG3EST = VG3NL * |(V_d - \sqrt{3}X_q I_q) + j(V_q + \sqrt{3}X_d I_d)| \quad \text{Eq. 1}$$

where:

$V_d$, $V_q$, $I_d$, $I_q$ are calculated from the measured terminal voltages and currents, and $X_d$, $X_q$, and VG3NL are settings.

According to one embodiment, in the steady-state, the values of $V_d$, $V_q$, $I_d$, $I_q$ may be calculated from the measured angle of the positive-sequence voltage V1A and the measured angle of the positive sequence current I1A:

$$\varphi = V1A - I1A \quad \text{Eq. 2}$$

$$\delta = \operatorname{atan2}\left(\frac{XQ \cdot I1M \cdot \cos\varphi}{V1M + XQ \cdot I1M \cdot \sin\varphi}\right) \quad \text{Eq. 3}$$

$$Vd = V1M \cdot \sin(\delta) \quad \text{Eq. 4}$$

$$Vq = V1M \cdot \cos(\delta) \quad \text{Eq. 5}$$

$$Id = I1M \cdot \sin(\delta + \varphi) \quad \text{Eq. 6}$$

$$Iq = I1M \cdot \cos(\delta + \varphi) \quad \text{Eq. 7}$$

Where V1M is the per-unit positive sequence voltage magnitude obtained from terminal voltages, and I1M is the per unit positive sequence current magnitude obtained from the phase currents measured at the terminals using sequence transformation. XQ is a per-unit user setting.

Using the calculated values, the internal voltage and estimate of the third harmonic generator voltage may be calculated as follows:

$$Ei = |(Vd - \sqrt{3} \cdot XQ \cdot Iq) + j(Vq + \sqrt{3} \cdot XD \cdot Iq)| \quad \text{Eq. 8}$$

$$VG3EST = VG3NL \cdot Ei \quad \text{Eq. 9}$$

To increase the security of stator ground fault detection, the system may determine satisfaction of additional elements before declaring a stator ground fault 320. For example, the stator ground fault signal 314 may be an input to AND gate 322, which may include further inputs before declaring the stator ground fault signal 320. For example, a check may be made to determine that the third harmonic voltage is sufficiently large before the stator ground fault 320 is declared. That is, the estimated generator third harmonic voltage VG3EST 304 may be compared with a multiple of the no-load generator voltage third harmonic VG3NL 306, and provide a signal 316 only when the VG3EST exceeds the multiple of the VG3NL. In such an instance, the AND gate 322 may provide the stator ground fault signal 320 upon occurrence of both signals 314 and 316.

Further, the system may provide a disturbance detector signal 318 upon pickup of a disturbance detector using positive and negative sequence current 308 for a predetermined time (such as, for example, 10 seconds). In such an instance, AND gate 322 may provide the stator ground fault signal 320 only when both signals 314 and 316 are present, and in the absence of the disturbance detector signal 318. As discussed earlier, the disturbance detector uses currents which remain practically unchanged for a stator-ground fault in a high-impedance grounded system. The disturbance detector is designed to pick up for disturbances such as external faults on the high side of the GSU or sudden changes in generator loading and block operation of the ground-fault detecting element. Using the disturbance detector signal 318 will ensure that the stator ground fault protection element remains secure for sudden significant change in the amount of third-harmonic produced by the generator, which does not occur during steady-state generator operation or a stator-ground fault.

As stated above, signals 316 and 318 provide additional security to the stator ground fault protection.

In one embodiment, the third harmonic terminal voltage and third harmonic neutral voltage may be used to determine a stator ground fault in a differential element. The following equation may be used to determine that a stator ground fault exists when the pickup value is exceeded:

$$k * VT3 - VN3 > \text{Pickup} \quad \text{Eq. 10}$$

where k may be a setting that may be estimated as a ratio of the third harmonic neutral voltage to the third harmonic terminal voltage over the entire operating range of the generator. The pickup value is set by the user to provide an adequate balance between security and coverage. Note that in some embodiments the quantities k, VT3 and VN3 are scalars indicating the magnitude of the quantities, whereas in other embodiments they can be phasors.

In another embodiment, the third harmonic terminal voltage and third harmonic neutral voltage may be used using a different ratio approach. The following equation may be used to determine that a stator ground fault exists when the pickup value is exceeded:

$$VT3/VN3 > \text{Pickup} \quad \text{Eq. 11}$$

where Pickup is a value that is set to a value above the ratio of the third harmonic terminal voltage to the third harmonic neutral voltage over the entire operating range of the generator. The pickup value is set by the user to provide an adequate balance between security and coverage.

The systems and methods described above determine a stator ground fault condition using terminal voltages and currents to estimate the third harmonic produced by the generator. That is, the voltage magnitude, current magnitude, and the angle difference between the voltage and current may be used to estimate the third harmonic generator voltage (as described above) and apply the stator ground protection.

In another embodiment, generator P and Q values may be used to estimate third-harmonic voltage at the generator, which may be used as described above to determine a stator ground fault. Specifically, the P and Q values may be divided by the positive-sequence voltage of the generator as measured by the PT's to obtain the current phasors. Then the same approach as above can be used. In another embodiment, P and Q may be divided by the rated voltage of the generator (a fixed value). Then the same approach as above can be used.

Figure 4:
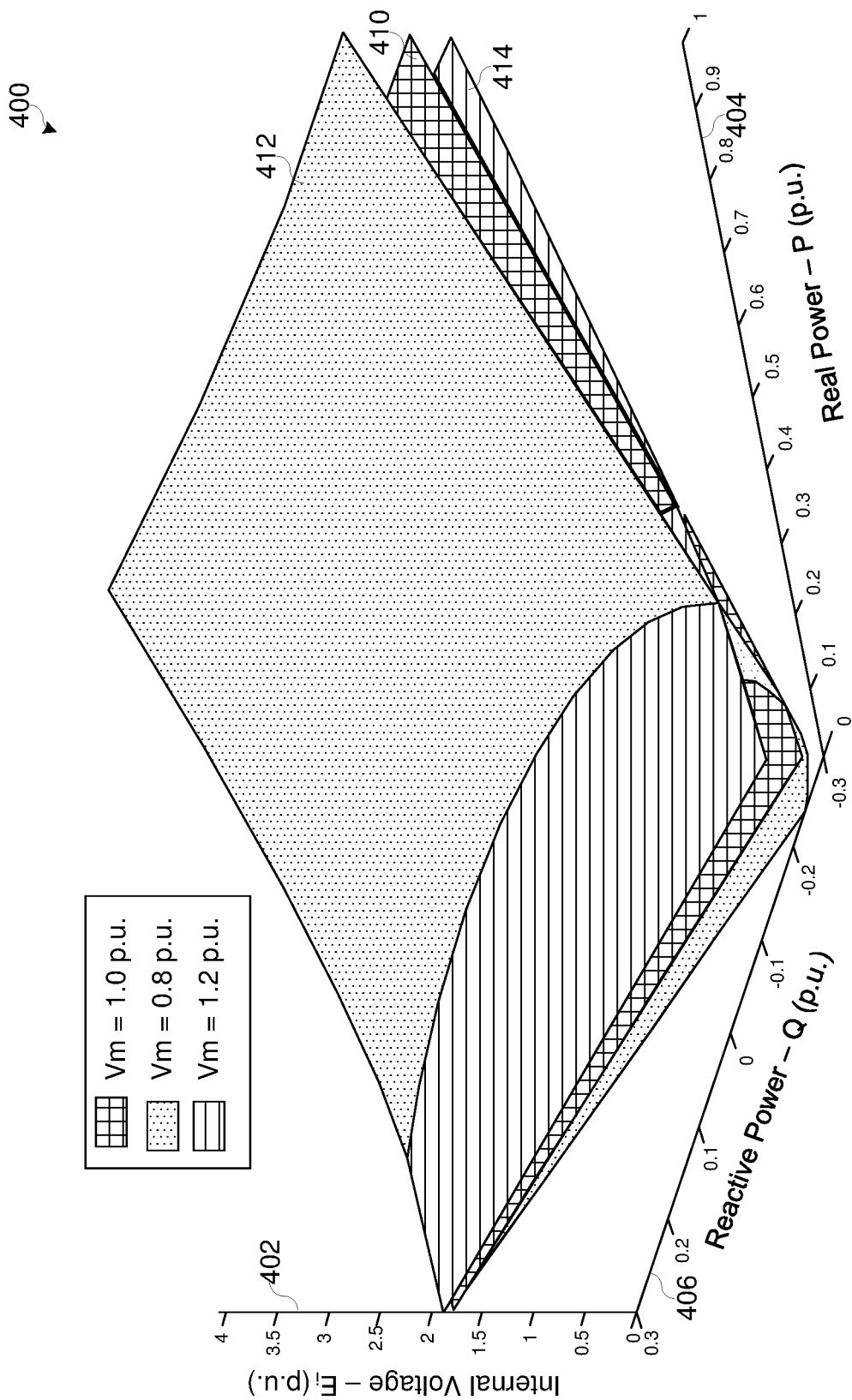
FIG. 4 illustrates a three dimensional plot of internal voltages with respect to real power and reactive power, in accordance with embodiments of the present disclosure.

FIG. 4 illustrates a three dimensional plot 400 of estimated internal voltages 402 with respect to active power (P) 404 and reactive power (Q) 406 for varying values of terminal voltage magnitudes (Vm) for a sample machine. By including three dimensions of inputs into the calculation of the internal voltage $E_i$, as described above in equations 3-9 above, a more accurate internal voltage may be determined than in calculations that use P (P=Vm*Im*cos($\varphi$)) and Q (Q=Vm*Im*sin($\varphi$)), an approach that uses 2 dimensions. Survey data is typically taken with Vm close to 1 p.u. and a method that uses P/Q values would be defined at the plane 410. When taking Vm into account as shown with each of planes 410, 412, and 414, the IED may allow for a better estimate of the third harmonic generator voltage produced by a machine, thereby allowing for more accurate stator ground fault detection.

Figure 5:
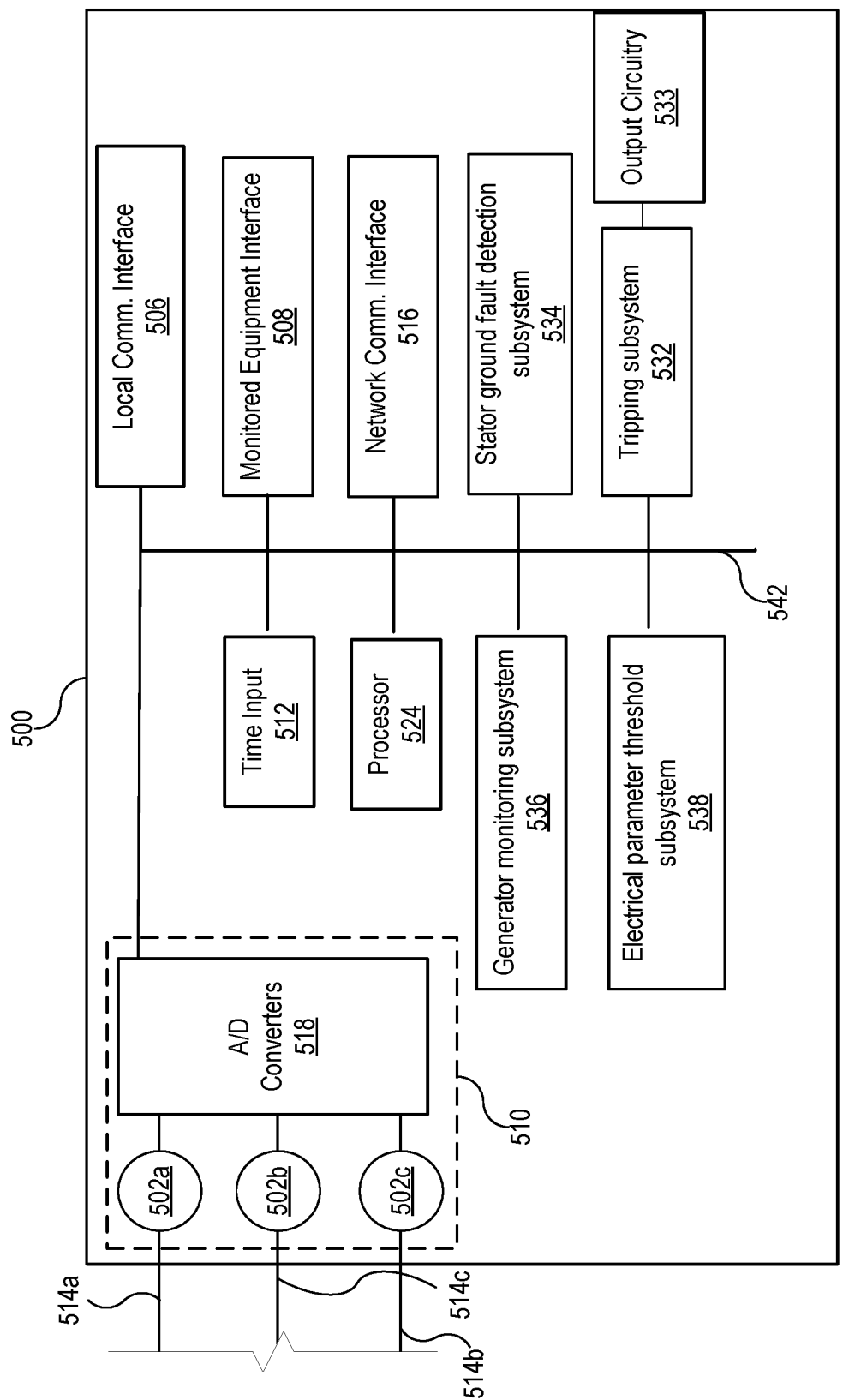
FIG. 5 illustrates a function block diagram of a generator protection element configured to provide stator ground protection, in accordance with embodiments of the present disclosure.

FIG. 5 illustrates a function block diagram of a generator protection element 400 configured to monitor an electric power generator and provide a variety of protection elements for the electric power generator, including stator ground fault detection and protection consistent with embodiments of the present disclosure. Generator protection element 500 may be configured to perform a variety of tasks using a configurable combination of hardware, software, firmware, and/or any combination thereof. FIG. 5 illustrates an embodiment that includes hardware and software, various embodiments of the present disclosure may be implemented in an embedded system, field programmable gate array implementations, and specifically designed integrated circuit. In some embodiments, functions described in connection with various software modules may be implemented in various types of hardware. Moreover, certain components or functions described herein may be associated with other devices or performed by other devices. The specifically illustrated configuration is merely representative of one embodiment consistent with the present disclosure.

Generator protection IED 500 includes a network communications interface 516 configured to communicate with other IEDs and/or system devices. In certain embodiments, the network communications interface 516 may facilitate direct communication with another IED or communicate with another IED over a communications network. The network communications interface 516 may facilitate communications with multiple IEDs. Generator protection element 500 may further include a time input 512, which may be used to receive a time signal allowing generator protection element 500 to apply a time-stamp to the acquired samples. In certain embodiments, a common time reference may be received via communications interface 516, and accordingly, a separate time input may not be required for time-stamping and/or synchronization operations. One such embodiment may employ the IEEE 1588 protocol. A monitored equipment interface 508 may be configured to receive status information from, and issue control instructions to, a piece of monitored equipment. In some embodiments, the monitored equipment may be a generator, and generator protection element 500 may be configured to control the operation of the generator.

A local communication interface 506 may also be provided for local communication with generator protection element 500. The local communication interface 506 may be embodied in a variety of ways, including as a serial port, a parallel port, a Universal Serial Bus (USB) port, an IEEE 1394 Port, and the like.

In certain embodiments, generator protection element 500 may include a sensor component 510 (e.g., sensor circuitry). In the illustrated embodiment, sensor component 510 is configured to gather data directly from a plurality of conductors 514a-c and may use, for example, A/D converters 518 that may sample and/or digitize filtered waveforms to form corresponding digitized current and voltage signals provided to data bus 542. Conductors 514a-c may be electrically connected to an output of a generator, such as to the terminals of the electric power generator. In some embodiments, sensor elements (502a, 502b, 502c) may reduce the voltage or current to a level appropriate for monitoring the generator using protection element 500. A/D converters 518 may include a single A/D converter or separate A/D converters for each incoming signal. A current signal may include separate current signals from each phase of a three-phase electric power system. A/D converters 518 may be connected to processor 524 by way of data bus 542, through which representations of electrical parameters determined by sensor elements 502a-c may be transmitted to processor 524. In various embodiments, the representations of electrical parameters may represent parameters, such as currents, voltages, frequencies, phases, and other parameters associated with an electric power distribution system. Sensor elements 502a-c may represent a variety of types of elements, such as voltage transformers, current transformers, status inputs, a breaker controller, etc.

Processor 524 may be configured to process communications received via communications interface 516, time input 512, monitored equipment interface 508, local communications interface 506, and/or sensor component 510. Processor 524 may operate using any number of processing rates and architectures. Processor 524 may be configured to perform various algorithms and calculations described herein. Processor 524 may be embodied as a general purpose integrated circuit, an application specific integrated circuit, a field-programmable gate array, and/or any other suitable programmable logic device. In some embodiments, the processor 524 may be generally referred to as processing circuitry.

A generator monitoring subsystem 536 may be configured to monitor the generator using measured values (currents, voltages, etc.) and/or values received over communications. In various embodiments, data received from A/D converters 518 may be analyzed by the generator monitoring subsystem 536. Further, such data may be stored for later use and/or transmitted by generator protection element 500 to another device or system in communication with generator protection element 500.

An electrical parameter threshold subsystem 538 may be configured to compare the calculated or estimated third harmonic values of the generator to a characteristic or thresholds as described above. The tripping characteristic may be represented, in various embodiments, as a mathematical function relating the stator ground fault protection as described herein. A variety of types of functions may be used in embodiments consistent with the present disclosure.

A tripping subsystem 532 may be configured to issue a trip command based upon satisfaction of the tripping characteristic. In various embodiments, the tripping subsystem 532 may be in communication with a breaker, recloser, or other device that may be configured to interrupt an electrical connection between the generator and an electric power generation and transmission system.

The tripping subsystem 532 may issue trip commands via an electrical interrupter, such as output circuitry 533. The output circuitry 533 may be electrically coupled to the circuit breaker. The processor 524 may selectively cause the output circuitry 533 to send a signal to the circuit breaker to open the circuit breaker based at least in part on declaring whether there is a stator ground fault 320 described with respect to FIG. 3. That is, the output circuitry 533 may selectively interrupt an electrical connection between the generator and the electric power generation and transmission system based on the trip command from the tripping subsystem 532.

In some embodiments, generator protection element 500 may be configured to detect the stator ground fault or other protection elements prior to issuing the trip command. The stator ground fault detection subsystem 534 may be configured in various embodiments to detect a stator ground fault condition according to several embodiments herein.

The above description provides numerous specific details for a thorough understanding of the embodiments described herein. However, those of skill in the art will recognize that one or more of the specific details may be omitted, or other methods, components, or materials may be used. In some cases, operations are not shown or described in detail. Furthermore, an Appendix is attached hereto and made a part hereof, which further describes and details embodiments of the invention described herein.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

The invention claimed is:

1. A system, comprising:
a generator configured to generate electrical energy for an electric power delivery system;
an intelligent electronic device (IED), comprising:
a generator monitoring subsystem configured to measure terminal voltages and currents of the generator;
a stator ground fault detection subsystem in communication with the generator monitoring subsystem and configured to calculate a generator third harmonic voltage using the terminal voltages and currents, calculate a ratio of a generator neutral third harmonic voltage value and the generator third harmonic voltage value, and determine a stator ground fault when the ratio is less than a predetermined threshold;
a tripping subsystem configured to issue a trip command based upon detection of the stator ground fault; and
an electrical interrupter configured to selectively interrupt an electrical connection between the generator and the electric power delivery system based on the trip command.

2. The system of claim 1, wherein the stator ground fault detection subsystem is further configured to determine the stator ground fault only when the calculated generator third harmonic voltage exceeds a scaled no-load generator third harmonic voltage.

3. The system of claim 1, wherein the stator ground fault detection subsystem is further configured to determine the stator ground fault only when a disturbance is not detected on the generator.

4. The system of claim 1, wherein the stator ground fault detection subsystem is further configured to calculate the generator third harmonic voltage using active power and reactive power values.

5. The system of claim 1, wherein the stator ground fault detection subsystem is further configured to calculate the generator third harmonic voltage using the terminal voltages, terminal currents, and an angle between the terminal voltages and the terminal currents.

6. The system of claim 5, wherein the terminal voltages comprise positive sequence voltage values and the terminal currents comprise positive sequence current values.

7. A method of monitoring an electrical generator using a generator protection element, comprising:
acquiring terminal voltages and currents of a generator;
calculating generator third harmonic voltage using the terminal voltages and currents;
calculating a ratio of a generator neutral third harmonic voltage and the calculated generator third harmonic voltage;
when the ratio is less than a predetermined threshold, declaring a stator ground fault condition; and
issuing a trip command based upon the declared stator ground fault condition.

8. The method of claim 7, further comprising determining whether the calculated generator third harmonic voltage exceeds a scaled no-load generator third harmonic voltage, and declaring the stator ground fault condition only when the calculated generator third harmonic voltage exceeds a percentage of the no-load generator third harmonic voltage.

9. The method of claim 7, further comprising determining if a disturbance has been detected on the generator, and declaring the stator ground fault condition only when the disturbance has not been detected.

10. The method of claim 7, further comprising calculating the generator third harmonic voltage using active power and reactive power values.

11. The method of claim 7, further comprising calculating the generator third harmonic voltage using terminal voltages, terminal currents, and an angle between the terminal voltages and the terminal currents.

12. The method of claim 11, wherein the terminal voltages comprise positive sequence voltage values and the terminal currents comprise positive sequence current values.

13. The method of claim 12, comprising:
receiving a field current measurement of the generator;
determining a normalized field current value by normalizing the field current measurement with respect to a rated field current; and
calculating the generator third harmonic voltage by multiplying the normalized field current value with a no-load third harmonic voltage setting.

14. An intelligent electronic device (IED), comprising:
memory; and
a processor operatively coupled to the memory, wherein the processor is configured to execute instructions stored on the memory to cause the processor to:
receive a neutral voltage measurement of a generator;
determine a neutral third harmonic voltage value based at least in part on the neutral voltage measurement;
estimate a generator third harmonic voltage value by multiplying an internal voltage of the generator times a no-load third harmonic voltage value;
calculate a ratio between the neutral third harmonic voltage value and the generator third harmonic voltage value;
compare the ratio to a predetermined threshold; and
selectively interrupt a circuit breaker based at least in part on the comparison.

15. The IED of claim 14, comprising sensor circuitry configured to provide digital representations of terminal voltage measurements of the generator.

16. The IED of claim 14, wherein the processor is configured to execute instructions stored on the memory to cause the processor to determine the neutral third harmonic voltage value by applying a filter to the neutral voltage measurement.

17. The IED of claim 14, wherein the processor is configured to execute instructions stored on the memory to cause the processor to determine that the estimate of the generator third harmonic voltage value is greater than a multiple of the no-load third harmonic voltage and to selectively interrupt the circuit breaker based on both the comparison of the ratio to the predetermined threshold and the estimate of the generator third harmonic voltage value being greater than the multiple of the no-load third harmonic voltage.

18. The IED of claim 14, wherein the processor is configured to execute instructions stored on the memory to cause the processor to determine the generator third harmonic voltage value as a sum of the neutral third harmonic voltage value and a terminal third harmonic value.

19. The IED of claim 14, comprising output circuitry electrically coupled to the circuit breaker, wherein the processor is configured to cause the output circuitry to send a signal to the circuit breaker to open the circuit breaker based at least in part on the comparison.

20. The IED of claim 14, wherein the processor is configured to execute instructions stored on the memory to cause the processor to determine that a stator ground fault is present based at least in part on a disturbance not being detected on the generator.

* * * * *